(12) United States Patent
Fujii et al.

(10) Patent No.: US 8,618,422 B2
(45) Date of Patent: Dec. 31, 2013

(54) ELECTRONIC COMPONENT

(71) Applicant: Murata Manufacturing Co., Ltd., Nagaokakyo (JP)

(72) Inventors: Yasuo Fujii, Nagaokakyo (JP); Yoshinao Nishioka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/873,303

(22) Filed: Apr. 30, 2013

(65) Prior Publication Data

US 2013/0233606 A1   Sep. 12, 2013

Related U.S. Application Data

(63) Continuation of application No. 13/600,303, filed on Aug. 31, 2012.

(30) Foreign Application Priority Data

Sep. 1, 2011   (JP) .................................. 2011-190735
Jun. 12, 2012   (JP) .................................. 2012-133216

(51) Int. Cl.
*H05K 1/02*   (2006.01)
*H05K 1/16*   (2006.01)

(52) U.S. Cl.
USPC .......................................................... 174/260

(58) Field of Classification Search
CPC .................................... H05K 1/02; H05K 1/16
USPC .......................................................... 174/260
See application file for complete search history.

(56) References Cited

PUBLICATIONS

Fujii et al., "Mounting Structure", U.S. Appl. No. 13/600,303, filed Aug. 31, 2012.

*Primary Examiner* — Timothy Thompson
*Assistant Examiner* — Charles Pizzuto
(74) *Attorney, Agent, or Firm* — Keating & Bennett, LLP

(57) ABSTRACT

A mounting structure includes an electronic component mounted on a circuit board. Land electrodes are disposed on a board body and are connected to outer electrodes of the electronic component through solders, respectively. A distance from each of the land electrodes to a top of the corresponding solder is not larger than about 1.27 times a distance from each of the land electrodes to an exposed portion of a capacitor conductor exposed at an end surface of the electronic component, the capacitor conductor being positioned closest to the circuit board.

10 Claims, 15 Drawing Sheets

FIG. 14
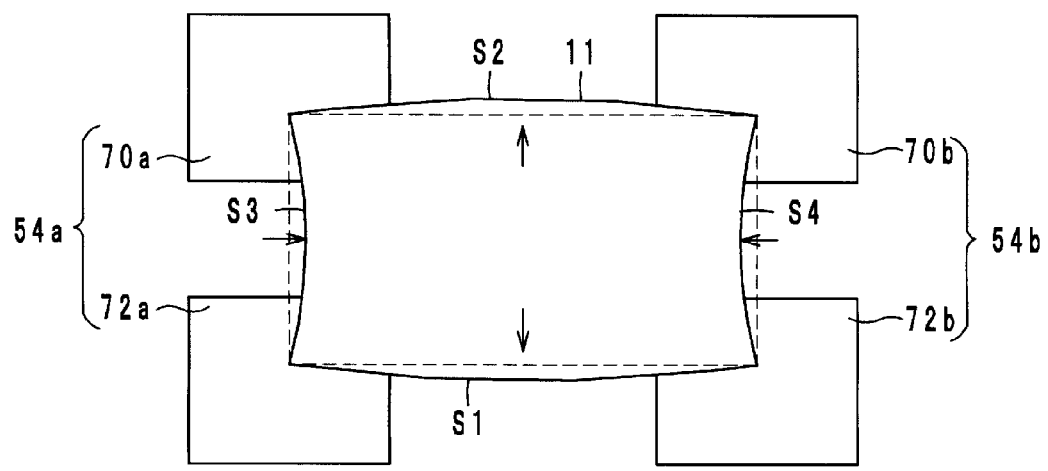
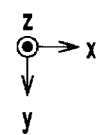

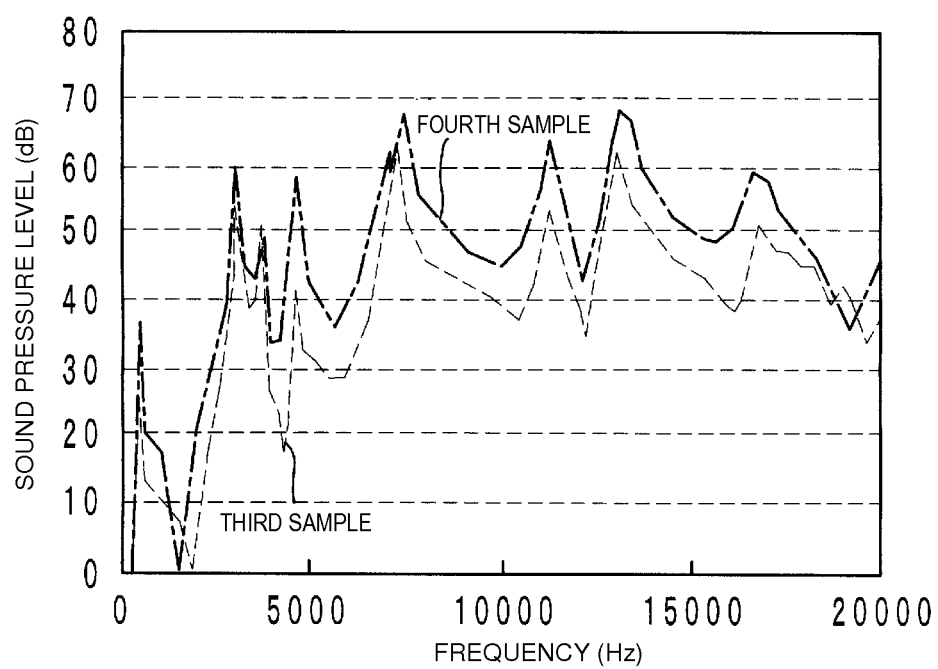

ELECTRONIC COMPONENT

BACKGROUND OF THE INVENTION

1. Field of the Invention

The present invention relates to a mounting structure, and more particularly to a mounting structure in which an electronic component, such as a capacitor, is mounted on a board.

2. Description of the Related Art

In an electronic component made up of dielectric layers and capacitor conductors successively laminated (stacked) on each other, when an AC voltage is applied to the electronic component, the applied voltage causes distortions induced by an electric field in the dielectric layers. Those electric-field induced distortions vibrate a board on which the electronic component is mounted, thereby generating vibration sounds called "acoustic noise". As an invention concerning a related-art electronic component intended to reduce the "acoustic noise", there is known, for example, Japanese Unexamined Patent Application Publication No. 2000-232030 that discloses a circuit board mounting method for a monolithic ceramic capacitor.

According to the circuit board mounting method for the monolithic ceramic capacitor, which is disclosed in Japanese Unexamined Patent Application Publication No. 2000-232030, two capacitors having the same specifications are arranged on a front surface and a rear surface of a circuit board. With that arrangement, vibration transmitted (propagated) from one capacitor to the circuit board and vibration transmitted from the other capacitor to the circuit board cancel each other. As a result, the "acoustic noise" is reduced.

However, the circuit board mounting method for the monolithic ceramic capacitor, disclosed in Japanese Unexamined Patent Application Publication No. 2000-232030, has the problem that the degree of freedom in circuit design is reduced because of the necessity of mounting two capacitors on both the surfaces of the circuit board.

SUMMARY OF THE INVENTION

Accordingly, preferred embodiments of the present invention provide a mounting structure which significantly reduces acoustic noise while maintaining a high degree of freedom in circuit design.

According to a first preferred embodiment of the present invention, a mounting structure includes an electronic component mounted on a board, wherein the electronic component includes a substantially rectangular parallelepiped laminate including a plurality of laminated dielectric layers, and including a mounting surface that faces the board and that is positioned on one side of the laminate in a lamination direction, and a first end surface and a second end surface that are opposed to each other, a plurality of capacitor conductors laminated together with the dielectric layers to define a capacitor, and led out to the first end surface or the second end surface, a first outer electrode disposed to extend over the first end surface and partly over the mounting surface, and connected to the capacitor conductors, a second outer electrode disposed to extend over the second end surface and partly over the mounting surface, and connected to the capacitor conductors, wherein the board includes a board body, and a first land electrode and a second land electrode disposed on the board body, the first land electrode and the second land electrode being connected respectively to the first outer electrode and the second outer electrode through conductive materials, and wherein a distance from the first land electrode or the second land electrode to a top of the conductive material is not larger than about 1.27 times a shortest one among distances from the first land electrode or the second land electrode to exposed portions of the capacitor conductors, which portions are exposed at the first end surface or the second end surface.

According to a second preferred embodiment of the present invention, a mounting structure includes an electronic component mounted on a board, wherein the electronic component includes a substantially rectangular parallelepiped laminate including a plurality of laminated dielectric layers, and including a mounting surface that is faces the board and that is positioned on one side of the laminate in a direction perpendicular or substantially perpendicular to a lamination direction, and a first end surface and a second end surface that are opposed to each other, a plurality of capacitor conductors laminated together with the dielectric layers to define a capacitor, and led out to the first end surface or the second end surface, a first outer electrode disposed to extend over the first end surface and partly over the mounting surface, and connected to the capacitor conductors, a second outer electrode disposed to extend over the second end surface and partly over the mounting surface, and connected to the capacitor conductors, wherein the board includes a board body, and a first land electrode and a second land electrode disposed on the board body, the first land electrode and the second land electrode being connected respectively to the first outer electrode and the second outer electrode through conductive materials, and wherein the first land electrode is divided into a first land portion and a second land portion, the first land portion and the second land portion are not overlapped with a central portion of the first end surface when looking at the laminate in a plan view from a direction normal to the board body, and the conductive material is not overlapped with the central portion of the first end surface when looking at the laminate in a plan view from the direction normal to the board body.

In the mounting structure according to the first preferred embodiment, since the distance from the first land electrode or the second land electrode to the top of the conductive material is not larger than about 1.27 times the shortest one among the distances from the first land electrode or the second land electrode to exposed portions of the capacitor conductors, which portions are exposed at the first end surface or the second end surface, the conductive materials acting as transmission media for vibration, which is generated in a portion of the laminate including the capacitor conductors, is positioned apart from a portion of the laminate, which portion vibrates in a maximum magnitude. As a result, the vibration is less transmittable to the circuit board.

In the mounting structure according to the second preferred embodiment, since the first land portion and the second land portion are not overlapped with the central portion of the first end surface when looking at the laminate in a plan view from the direction normal to the board body and the conductive material is also not overlapped with the central portion of the first end surface when looking at the laminate in a plan view from the direction normal to the board body, the land electrode and the conductive material acting as transmission media for vibration, which is generated in a portion of the laminate including the capacitor conductors, are not connected to a portion of the laminate, which portion vibrates in a maximum magnitude. As a result, the vibration is less transmittable to the circuit board.

With various preferred embodiments of the present invention, since vibration is dampened even when only one electronic component is mounted, the acoustic noise can be reduced while a high degree of freedom can be obtained in circuit design.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 illustrates a state where the electronic component vibrates in the second preferred embodiment of the present invention.

FIG. 15 is a graph representing experimental results with the second preferred embodiment of the present invention.

DETAILED DESCRIPTION OF THE PREFERRED EMBODIMENTS

Figure 1:
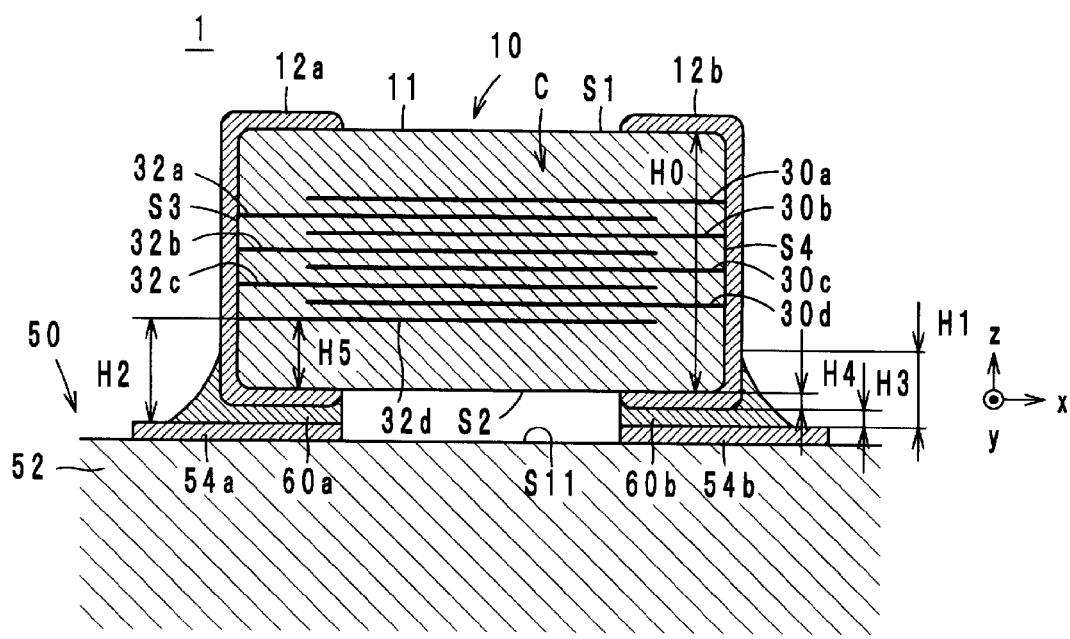
FIG. 1 is a sectional structural view of a mounting structure according to a first preferred embodiment of the present invention.

A mounting structure according to various preferred embodiments of the present invention will be described below with reference to the accompanying drawings. It is to be noted that similar members and components are denoted by common reference symbols in the drawings and duplicate description is omitted.

First Preferred Embodiment

Figure 2:
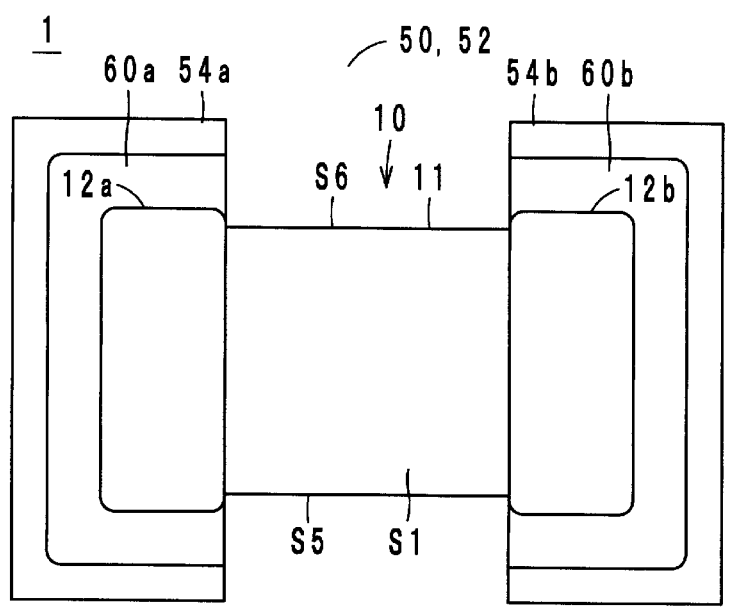
FIG. 2 is a plan view of the mounting structure according to the first preferred embodiment of the present invention.
Figure 3:
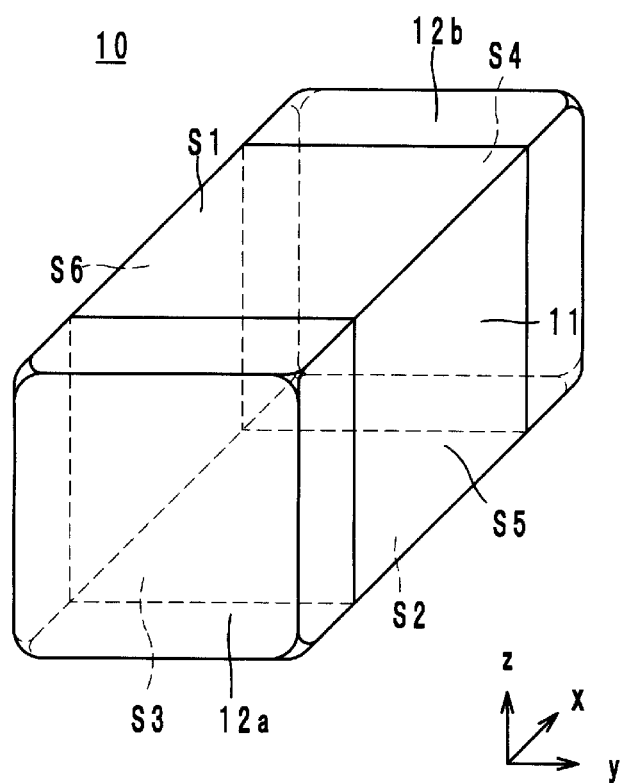
FIG. 3 is an external perspective view of an electronic component according to the first preferred embodiment of the present invention.
Figure 4:
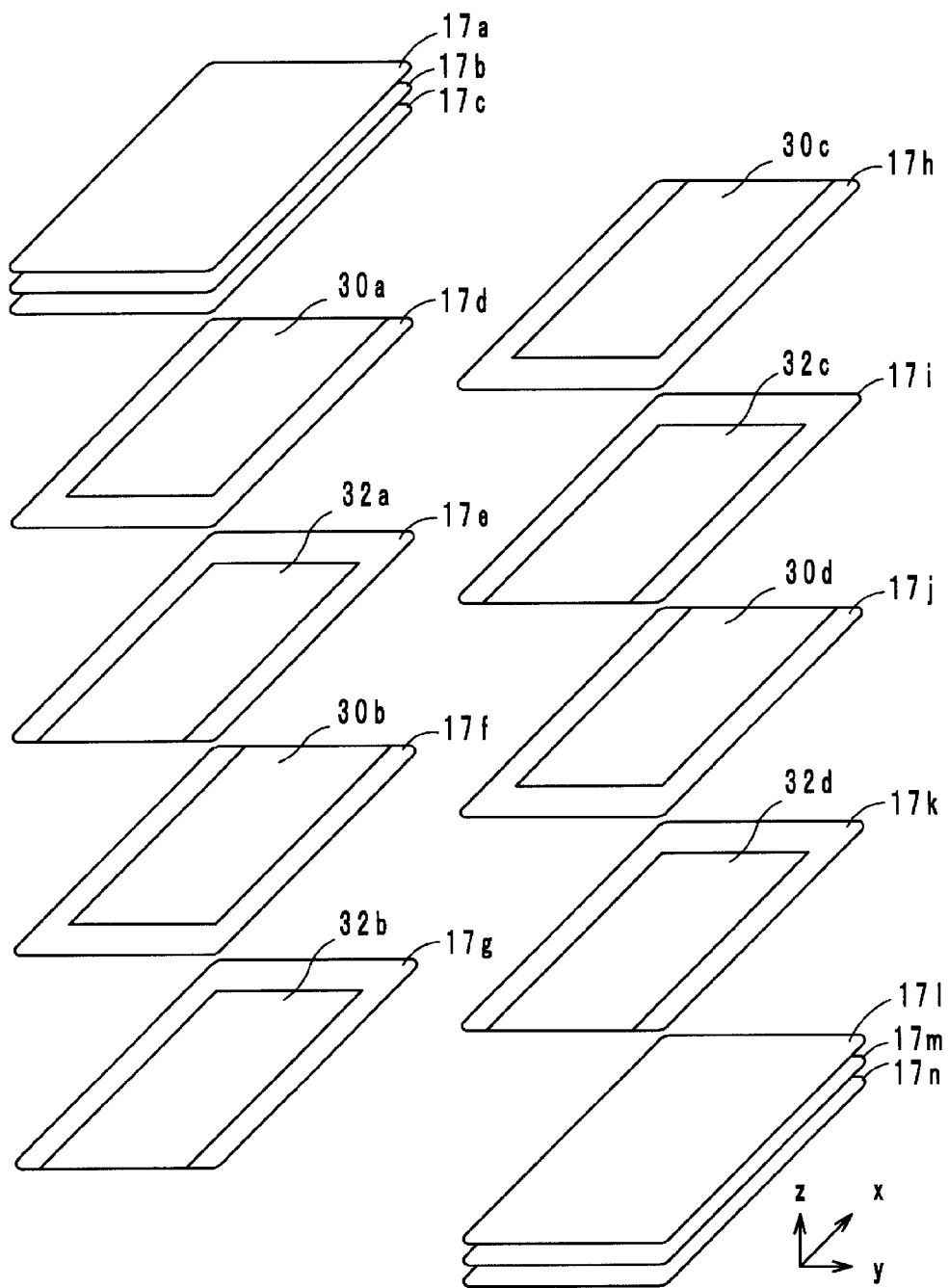
FIG. 4 is an exploded perspective view of a laminate of the electronic component illustrated in FIG. 3.

First, a mounting structure 1 according to a first preferred embodiment is described with reference to FIGS. 1 to 4. As illustrated in FIGS. 1 and 2, the mounting structure 1 includes an electronic component 10 and a circuit board 50. The electronic component 10 preferably is a chip capacitor, for example, and is mounted on the circuit board 50. As also illustrated in FIGS. 3 and 4, the electronic component 10 includes a laminate 11, outer electrodes 12 (12a and 12b), and capacitor conductors 30 (30a to 30d) and 32 (32a to 32d). In the following description, a lamination direction in which multiple layers are laminated in the laminate 11 is defined as a z-axis direction. A direction in which a long side of the laminate 11 extends when looking at the laminate 11 in a plan view from the z-axis direction is defined as an x-axis direction. A direction in which a short side of the laminate 11 extends when looking at the laminate 11 in a plan view from the z-axis direction is defined as a y-axis direction.

As illustrated in FIG. 3, the laminate 11 preferably has a substantially rectangular parallelepiped shape including a top surface S1 and a bottom surface S2 positioned at both ends of the laminate 11 in the z-axis direction, end surfaces S3 and S4 opposed to each other, and lateral surfaces S5 and S6 opposed to each other. The laminate 11 is preferably chamfered such that corners and ridges of the laminate 11 are rounded, for example. In the following description, a surface of the laminate 11, which is positioned on the positive side in the z-axis direction, is defined as the top surface S1, and a surface of the laminate 11, which is positioned on the negative side in the z-axis direction, is defined as the bottom surface S2. Further, a surface of the laminate 11, which is positioned on the negative side in the x-axis direction, is defined as the end surface S3, and a surface of the laminate 11, which is positioned on the positive side in the x-axis direction, is defined as the end surface S4. A surface of the laminate 11, which is positioned on the positive side in the y-axis direction, is defined as lateral surface S5, and a surface of the laminate 11, which is positioned on the negative side in the y-axis direction, is defined as the lateral surface S6. The bottom surface S2 serves as a mounting surface that is positioned to face the circuit board 50 when the electronic component 10 is mounted to the circuit board 50.

The laminate 11 is preferably constructed, as illustrated in FIG. 4, by laminating a plurality of ceramic layers (dielectric layers) 17 (17a to 17n) such that the ceramic layers 17 are successively stacked in the order from the positive side to the negative side in the z-axis direction. Each ceramic layer 17 preferably is substantially rectangular and is made of a dielectric ceramic, for example. In the following description, a principal surface of the ceramic layer 17 on the positive side in the z-axis direction is called a front surface, and a principal surface of the ceramic layer 17 on the negative side in the z-axis direction is called a rear surface.

The top surface S1 of the laminate 11 is constituted by a front surface of the ceramic layer 17a that is disposed on the most positive side in the z-axis direction. The bottom surface S2 of the laminate 11 is constituted by a rear surface of the ceramic layer 17n that is disposed on the most negative side in the z-axis direction. Further, the end surface S3 is constituted by continuously laminated short sides of the ceramic layers 17a to 17n on the negative side in the x-axis direction. The end surface S4 is constituted by continuously laminated short sides of the ceramic layers 17a to 17n on the positive side in the x-axis direction. The lateral surface S5 is constituted by continuously laminated long sides of the ceramic layers 17a to 17n on the positive side in the y-axis direction. The lateral surface S6 is constituted by continuously laminated long sides of the ceramic layers 17a to 17n on the negative side in the y-axis direction.

The capacitor conductors 30a to 30d and 32a to 32d are laminated together with the ceramic layers 17 such that adjacent two of the capacitor conductors are opposed to each other with the ceramic layer 17 interposed therebetween.

As illustrated in FIG. 4, the capacitor conductors 30a to 30d are disposed on surfaces of the ceramic layers 17d, 17f, 17h and 17j, respectively, and are incorporated in the laminate 11. The capacitor conductors 30a to 30d preferably are each substantially rectangular and are led out to the short sides of the ceramic layers 17d, 17f, 17h and 17j on the positive side in the x-axis direction, respectively. With such an arrangement, the capacitor conductors 30a to 30d are led out to the end surface S4 (first end surface), as illustrated in FIG. 1.

As illustrated in FIG. 4, the capacitor conductors 32a to 32d are disposed on surfaces of the ceramic layers 17e, 17g, 17i and 17k, respectively, and are incorporated in the laminate 11. The capacitor conductors 32a to 32d preferably are each substantially rectangular and are led out to the short sides of the ceramic layers 17e, 17g, 17i and 17k on the negative side in the x-axis direction, respectively. With such an arrangement, the capacitor conductors 32a to 32d are led out to the end surface S3 (second end surface), as illustrated in FIG. 1. The capacitor conductors 30a to 30d and the capacitor conductors 32a to 32d are overlapped with each other when looking at the laminate 11 in a plan view from the z-axis direction. As a result, a capacitor C is defined between the capacitor conductors 30 and 32.

The outer electrode 12a (second outer electrode) covers the end surface S3, and it is folded to partly cover the top surface S1, the bottom surface S2, and the lateral surfaces S5 and S6. In other words, the outer electrode 12a is disposed to extend over not only the end surface S3, but also partly over the top surface S1, the bottom surface S2, and the lateral surfaces S5 and S6. Furthermore, the outer electrode 12a is connected to the capacitor conductors 32a to 32d. More specifically, the outer electrode 12a covers the entire end surface S3 of the laminate 11 such that exposed portions of the capacitor conductors 32a to 32d exposed at the end surface S3 are covered with the outer electrode 12a.

The outer electrode 12b (first outer electrode) covers the end surface S4, and it is folded to partly cover the top surface S1, the bottom surface S2, and the lateral surfaces S5 and S6. In other words, the outer electrode 12b is disposed to extend over not only the end surface S4, but also partly over the top surface S1, the bottom surface S2, and the lateral surfaces S5 and S6. Furthermore, the outer electrode 12b is connected to the capacitor conductors 30a to 30d. More specifically, the outer electrode 12b covers the entire end surface S4 of the laminate 11 such that exposed portions of the capacitor conductors 30a to 30d, which are exposed at the end surface S4, are covered with the outer electrode 12b.

The circuit board 50 is a multilayer board including circuits, not illustrated, on the surface and in the inside thereof. The circuit board 50 includes a board body 52 and land electrodes 54 (54a and 54b). The board body 52 is preferably constituted by laminating a plurality of insulator layers, and includes a principal surface S11. As illustrated in FIG. 1, the principal surface S11 is a principal surface of the board body 52 on the positive side in the z-axis direction.

The land electrodes 54 are disposed on the principal surface S11 of the board body 52 and are connected to the outer electrodes 12a and 12b through conductive materials (solders 60a and 60b). More specifically, as illustrated in FIG. 2, when looking at the laminate 11 in a plan view from the z-axis direction, the land electrodes 54a and 54b preferably are each substantially rectangular and are arranged in the order from the negative side to the positive side in the x-axis direction.

As illustrated in FIGS. 1 and 2, the outer electrodes 12a and 12b are placed on the land electrodes 54a and 54b and are fixed to the land electrodes 54a and 54b in states electrically connected thereto through solders 60a and 60b, respectively.

As illustrated in FIG. 1, the solders 60a and 60b not only fill respective gaps between the outer electrodes 12a, 12b and the land electrodes 54a, 54b, but also extend along respective portions of the outer electrodes 12a and 12b, which portions cover the lateral surfaces S3 and S4, toward the positive side in the z-axis direction.

For the purpose of reducing the acoustic noise and increasing the degree of freedom in circuit design, the mounting structure 1 is structured as follows. First, heights or distances from surfaces (upper surfaces) of the land electrodes 54a and 54b on the positive side in the z-axis direction to tops of the solders 60a and 60b are each defined as H1. The tops of the solders 60a and 60b imply ends of the solders 60a and 60b, positioned on the positive side in the z-axis direction, which extend over the outer electrodes 12a and 12b covering the lateral surfaces S3 and S4, respectively. Further, the height implies a distance in the z-axis direction. In the following description, the height H1 from each of the surfaces (upper surfaces) of the land electrodes 54a and 54b on the positive side in the z-axis direction to each of the tops of the solders 60a and 60b are also called a solder fillet height. Moreover, shortest ones among distances from the land electrodes 54a and 54b to the exposed portions of the capacitor conductors 30a to 30d and 32a to 32d exposed at the end surfaces S3 and S4 are each defined by H2. In other words, H2 implies a height from each of the land electrodes 54a and 54b to an exposed portion of the capacitor conductor 32d exposed at the end surface S3, the capacitor conductor 32d being positioned closest to the circuit board 50. Given those definitions, H1 is preferably set to be not larger than about 1.27 times H2, for example.

A non-limiting example of a method of manufacturing the electronic component 10 will be described below with reference to the drawings, specifically FIGS. 3 and 4.

First, ceramic slurry is obtained by adding a binder and an organic solvent to ceramic powder of $BaTiO_3$, for example, putting them into a ball mill, and wet-mixing those materials for preparation of the ceramic slurry. Then, a ceramic green sheet to be used as the ceramic layer 17 is fabricated by coating the obtained ceramic slurry in the form of a sheet over a carrier sheet with the doctor blade method, and drying the coated ceramic slurry. A thickness of the ceramic green sheet to be used as the ceramic layer is preferably set such that the ceramic layer after firing has a thickness of about 0.5 μm or more and about 10 μm or less, for example. It is noted that a main constituent of the ceramic powder may be selected from $CaTiO_3$, $SrTiO_3$, $CaZrO_3$, etc. Furthermore, a Mn compound, a Mg compound, a Si compound, a Co compound, a Ni compound, a rare-earth compound, etc. may be optionally added as an accessory constituent of the ceramic powder.

Next, the capacitor conductors 30 and 32 are each formed by coating a paste made of a conductive material over the ceramic green sheet to be used as the ceramic layer 17 with the screen printing method. The paste made of the conductive material is prepared by adding an organic binder and an organic solvent to metal powder. The metal powder is optionally made of, e.g., Ni, Cu, Ag, Pd, an Ag—Pd alloy, Au, etc. A thickness of each of the capacitor conductors 30 and 32 after firing is preferably about 0.3 μm or more and about 2.0 μm or less, for example.

Next, the ceramic green sheets to be used as the ceramic layers 17 are laminated one above another, whereby a mother laminate before firing is obtained. The mother laminate before firing is then pressed.

Next, the mother laminate before firing is cut in a predetermined size to obtain a plurality of laminates 11 before firing. Surfaces of each of the laminates 11 before firing are then subjected to polishing, e.g., barrel polishing.

Next, the laminate 11 before firing is fired. A firing temperature is, e.g., about 1200° C. to about 1300° C., for example.

Next, the outer electrodes 12 (12a and 12b) are formed on the laminate 11 after the firing. More specifically, a conductive paste optionally containing Cu, Ni, Ag, Pd, an Ag—Pd alloy, Au, etc. is coated over surfaces of the laminate 11 by suitable one of the known techniques, e.g., the dipping method or the slit method. An underlying electrode is then formed by baking the conductive paste. Ni plating and Sn plating are carried out on the underlying electrode. As a result, the outer electrodes 12 are formed. The electronic component 10 is completed through the above-described steps.

The electronic component 10 thus manufactured is mounted on the circuit board 50. The board body 52 is constituted by laminating a plurality of insulator layers that are each made of, e.g., a glass epoxy resin. Further, the land electrodes 54 are each formed by coating a plated film over an underlying electrode made of Cu. When mounting the electronic component 10, a solder paste is first coated over the land electrode 54. The outer electrodes 12 of the electronic component 10 are then set on the land electrodes 54, respectively, such that the bottom surface S2 is positioned to face the principal surface S11 of the board body 52. At that time, the bottom surface S2 and the principal surface S11 are preferably held parallel or substantially parallel to each other. Further, after carrying out a reflow process to melt the solder paste, the molten solder paste is solidified. As a result, the electronic component 10 is mounted on the circuit board 50.

For example, a Sn—Pb eutectic solder or a lead-free solder, e.g., a Sn—Ag—Cu alloy, can be used as the solder paste. Additionally, a conductive adhesive may be used instead of the solder 60.

Figure 5:
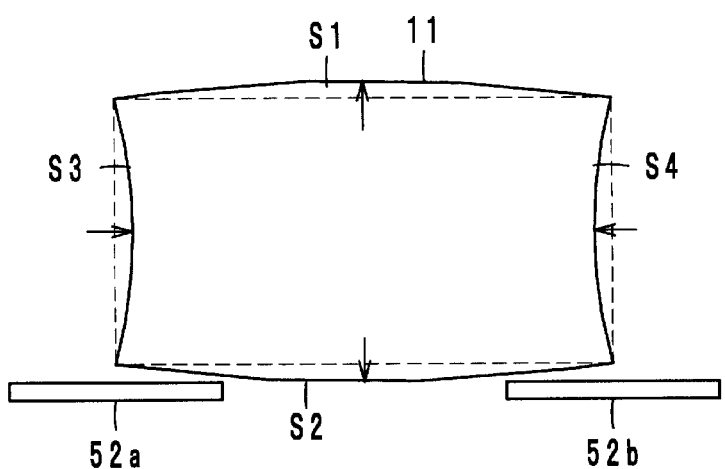
FIG. 5 illustrates a state where the electronic component vibrates in the first preferred embodiment of the present invention.

With the mounting structure 1 thus constructed, it is possible to not only reduce the acoustic noise, but also to provide a high degree of freedom in circuit design as described below. FIG. 5 illustrates a state where the electronic component 10 vibrates in the mounting structure 1.

As discussed above, the circuit board mounting method for the monolithic ceramic capacitor, disclosed in Japanese Unexamined Patent Application Publication No. 2000-232030, has the problem that the degree of freedom in circuit design is reduced because two capacitors are mounted to both the surfaces of the circuit board in order to reduce the acoustic noise.

To cope with that problem, in the mounting structure 1, the height (solder fillet height) H1 from each of the surfaces of the land electrodes 54a and 54b on the positive side in the z-axis direction to each of the tops of the solders 60a and 60b is preferably set to be not larger than about 1.27 times the height H2 from each of the land electrodes 54a and 54b to the exposed portion of the capacitor conductor 32d exposed at the end surface S3, for example, the capacitor conductor 32d being positioned closest to the circuit board 50. Under those conditions, the mounting structure 1 can realize, as described below, the reduction of the acoustic noise without using two electronic components 10.

In more detail, in the mounting structure 1, vibration generated in a portion of the laminate 11 where the capacitor conductors 30 and 32 are disposed is transmitted through the solders 60 and the land electrodes 54, whereby the circuit board 50 is vibrated and the acoustic noise is caused. As illustrated in FIG. 5, the electronic component 10 (i.e., the laminate 11) vibrates in a larger magnitude at a position closer to a center of each of the end surfaces S3 and S4 in the z-axis direction. Taking such a point into consideration, in the mounting structure 1, the solders 60 each acting as a transmission path for the vibration are disposed apart from the centers of the end surfaces S3 and S4 in the z-axis direction, which are vibration sources. With such an arrangement, the vibration generated in the electronic component 10 is less transmittable to the circuit board 50. As a result, the acoustic noise is reduced in the mounting structure 1.

For more positively confirming the advantageous effects of the mounting structure 1, the inventors of this application conducted experiments as follows. In more detail, the inventors prepared a first sample group and a second sample group described below. In each of the first sample group and the second sample group, the solder fillet height H1 was changed as listed in the following condition.

Conditions for First Sample Group
  Size of the circuit board: 100 mm×40 mm×1.6 mm
  External dimensions of the electronic component: 1.75 mm×0.95 mm×0.91 mm
  Capacitance of the electronic component: 22 µF
  Thickness of the ceramic layer: 0.94 µm
  Thickness of the capacitor conductor: 0.58 µm
  Number of the capacitor conductors: 491
  Height H0 (see FIG. 1) of the laminate: 0.87 mm
  Solder fillet height: six different values, i.e., 0.08 mm, 0.16 mm, 0.32 mm, 0.5 mm, 0.6 mm, and 0.8 mm
  Gap H3 (see FIG. 1) between the outer electrode and the land electrode: 0.05 mm
  Thickness H4 (see FIG. 1) of the outer electrode: 20 µm
  Distance H5 (see FIG. 1) from the capacitor conductor, which is positioned closest to the circuit board, to the bottom surface of the laminate (i.e., thickness of outer layer of the laminate): 56 µm In the first sample group, the height H2 from the land electrode to the exposed portion of the capacitor conductor exposed at the end surface, the capacitor conductor being positioned closest to the circuit board, is a total (126 µm) of H3, H4 and H5.

Conditions for Second Sample Group
  Size of the circuit board: 100 mm×40 mm×1.6 mm
  External dimensions of the electronic component: 2.11 mm×1.35 mm×1.31 mm
  Capacitance of the electronic component: 47 µF
  Thickness of the ceramic layer: 0.94 µm
  Thickness of the capacitor conductor: 0.62 µm
  Number of the capacitor conductors: 671
  Height H0 (see FIG. 1) of the laminate: 1.26 mm
  Solder fillet height: five different values, i.e., 0.08 mm, 0.21 mm, 0.4 mm, 0.75 mm, and 1.2 mm
  Gap H3 (see FIG. 1) between the outer electrode and the land electrode: 0.05 mm
  Thickness H4 (see FIG. 1) of the outer electrode: 25 µm
  Distance H5 (see FIG. 1) from the capacitor conductor, which is positioned closest to the circuit board, to the bottom surface of the laminate (i.e., thickness of outer layer of the laminate): 90 µm In the second sample group, the height H2 from the land electrode to the exposed portion of the capacitor conductor exposed at the end surface, the capacitor conductor being positioned closest to the circuit board, is a total (165 µm) of H3, H4 and H5.

Figure 6:
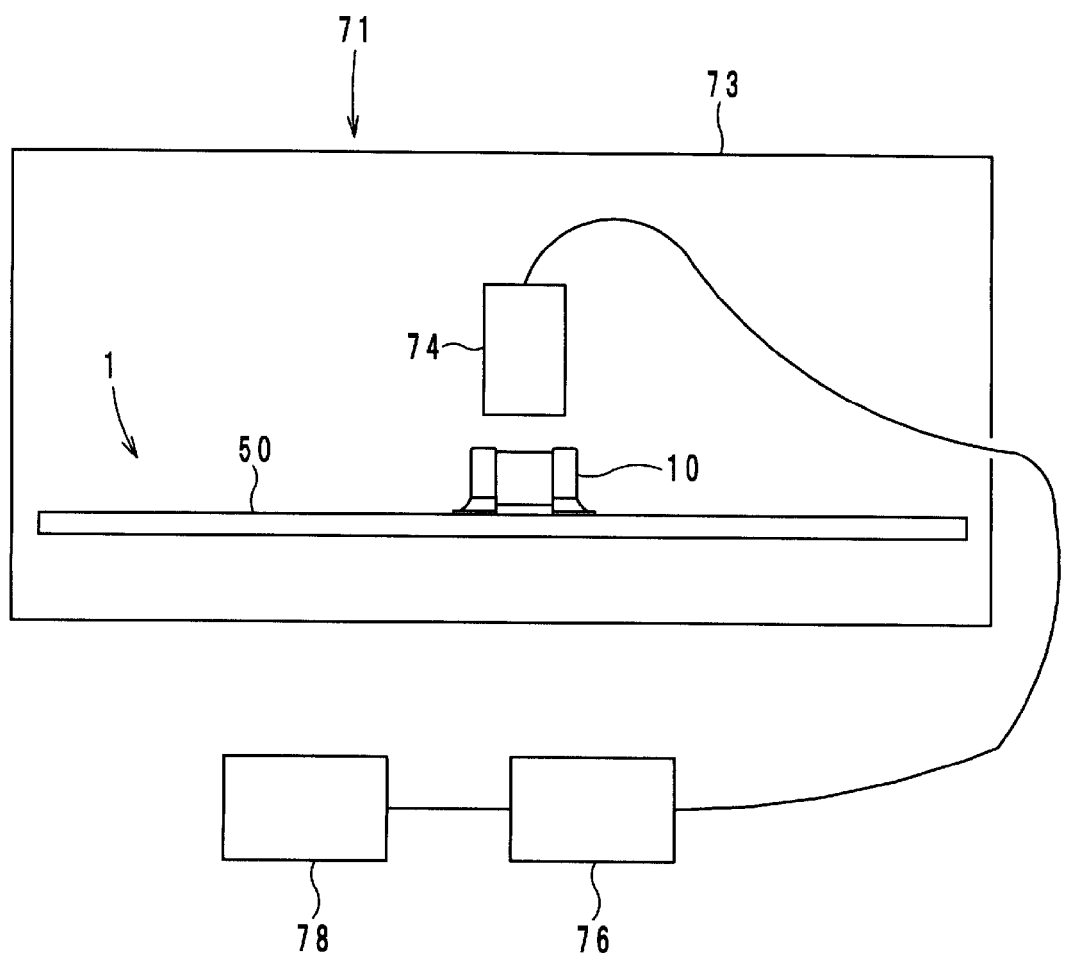
FIG. 6 is a schematic view of a device for measuring a sound pressure level.

A suppression rate of a sound pressure level was measured on the first sample group and the second sample group both prepared as described above. FIG. 6 is a schematic view of a device 71 for measuring a sound pressure level.

Figure 7:
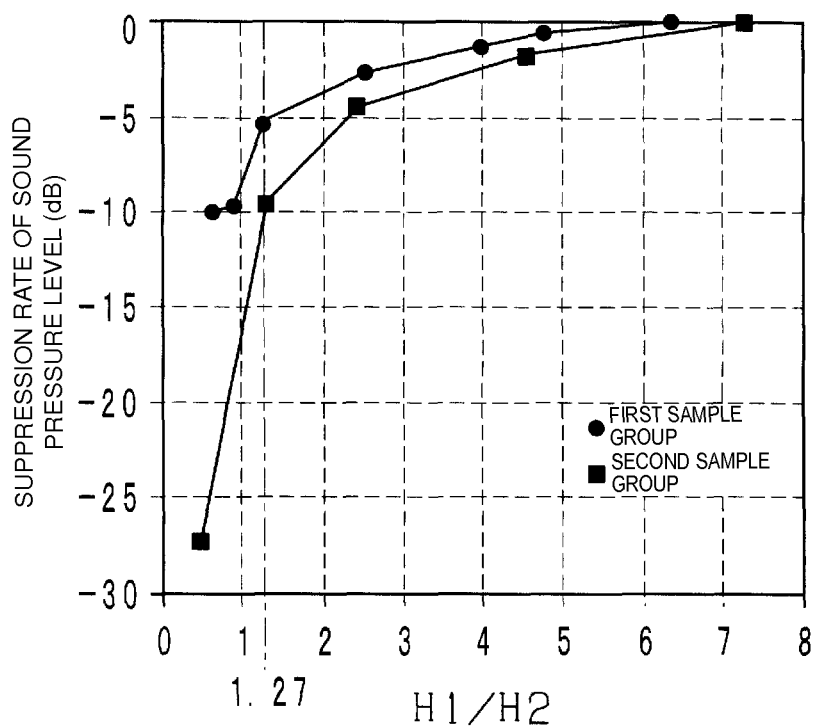
FIG. 7 is a graph representing experimental results with the first preferred embodiment of the present invention.

The inventors conducted the measurement by placing the mounting structure 1 (i.e., each sample in the first sample group and the second sample group) in an anechoic box 73, and by applying an AC voltage with a frequency of 3 kHz and a voltage of 1 Vpp to the electronic component 10. Further, acoustic noise caused at that time was collected by a sound collecting microphone 74, and a sound level of the collected acoustic noise was measured by using a sound collection meter 76 and an FET analyzer 78 (CF-5220 made by Ono Sokki Co., Ltd.). The sound collecting microphone 74 was installed at a position away from the circuit board 50 through a distance of 3 mm. FIG. 7 is a graph representing the experimental results. In the graph, the vertical axis indicates the suppression rate of the sound pressure level, and the horizontal axis indicates a value of H1/H2. The term "suppression rate of the sound pressure level" implies a rate at which the sound pressure level is suppressed in comparison with that in the case of H1/H2=8.

As seen from FIG. 7, in both the first sample group and the second sample group, when H1/H2 is not larger than about 1.27, the suppression rate of the sound pressure level is drastically increased in comparison with that when H1/H2 is larger than about 1.27. It is hence understood from the experimental results that the acoustic noise can be reduced by setting H1 to be not larger than about 1.27 times H2, for example.

First Modification of a Preferred Embodiment

Figure 8:
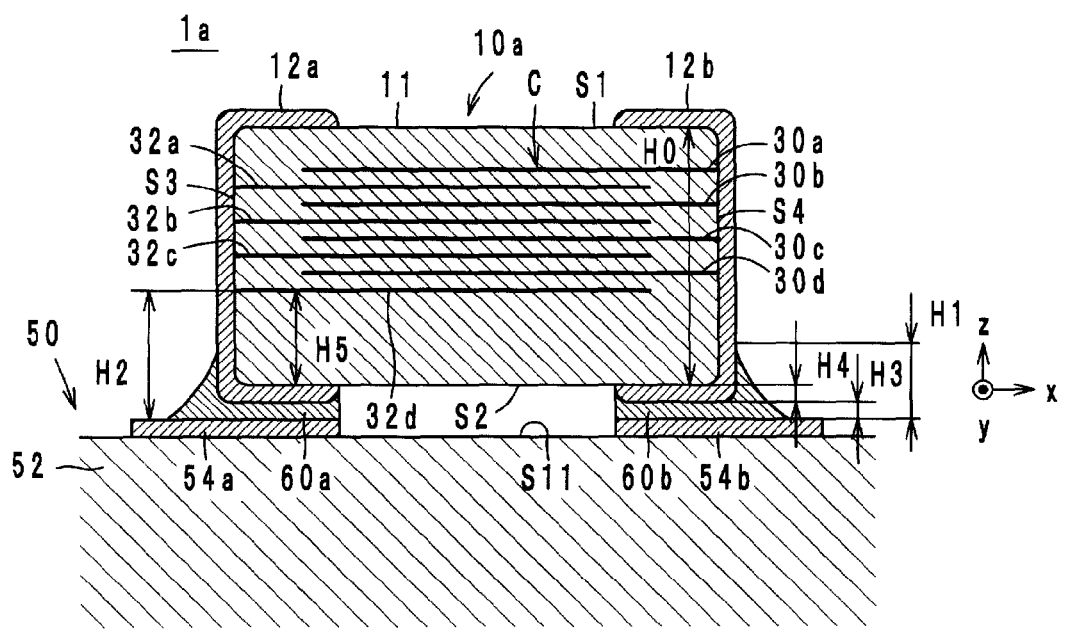
FIG. 8 is a sectional structural view of a mounting structure according to a first modification of a preferred embodiment of the present invention.

A mounting structure 1a according to a first modification of a preferred embodiment of the present invention will be described below with reference to the drawings. FIG. 8 is a sectional structural view of the mounting structure 1a according to the first modification.

The mounting structure 1a differs from the above-described mounting structure 1 in positions of the capacitor conductors 30 and 32. More specifically, the capacitor conductors 30 and 32 of the mounting structure 1a are positioned on the more positive side in the z-axis direction than the capacitor conductors 30 and 32 of the mounting structure 1. In other words, a distance H5 between the bottom surface S2 and the capacitor conductor 32d is larger than a distance between the top surface S1 and the capacitor conductor 30a. With such an arrangement, the height H2 in the mounting structure 1a from each of the land electrodes 54a and 54b to the exposed portion of the capacitor conductor 32d exposed at the end surface S3, the capacitor conductor 32d being positioned closest to the circuit board 50, is larger than that in the mounting structure 1. As a result, H1/H2 is smaller in the mounting structure 1a than in the mounting structure 1. Thus, the acoustic noise is more effectively reduced in the mounting structure 1a.

Second Modification of a Preferred Embodiment

Figure 9A:
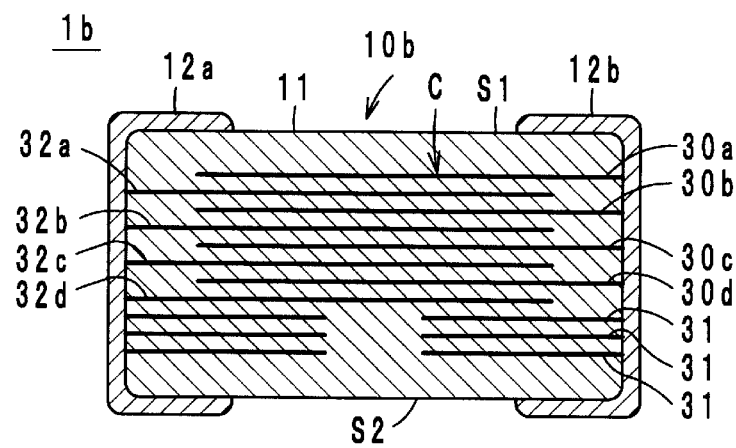
FIGS. 9A and 9B are each a sectional structural view of an electronic component constituting a mounting structure according to a second modification of a preferred embodiment of the present invention.
Figure 9B:
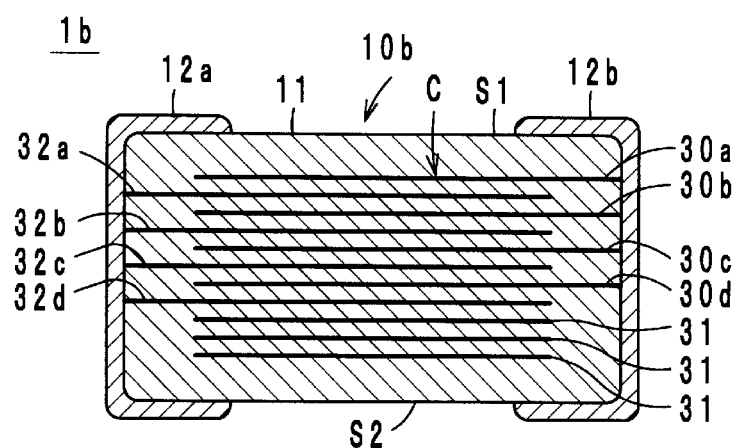

A mounting structure 1b according to a second modification of a preferred embodiment of the present invention will be described below with reference to the drawings. FIGS. 9A and 9B each illustrate an electronic component 10b mounted in the mounting structure 1b.

In the mounting structure 1a according to the first modification, the distance between the bottom surface S2 and the capacitor conductor 32d is larger than that between the top surface S1 and the capacitor conductor 30a. Stated another way, an outer layer portion of the laminate 11 on the lower side is thicker than an outer layer portion thereof on the upper side, and both the outer layer portions are asymmetrical. Therefore, when a mother laminate is fabricated in a manufacturing process for an electronic component 10a according to the first modification, there is a risk that, if heat is applied to the mother laminate, the mother laminate would be entirely warped and subsequent processes could not be carried out.

To cope with such a problem, in the mounting structure 1b according to the second modification, an appropriate number of dummy conductors 31 are disposed in the ceramic layers between the bottom surface S2 and the capacitor conductor 32d. As illustrated in FIG. 9A, the dummy conductors 31 may be each separated or disconnected in a central portion of the laminate 11 in the x-axis direction, and both ends of each dummy conductor 31 may be connected respectively to the outer electrodes 12a and 12b. Alternatively, as illustrated in FIG. 9B, the dummy conductors 31 may be disposed in a central portion of the laminate 11 in the x-axis direction such that the dummy conductors 31 are held in an electrically isolated state without being connected to the outer electrodes 12a and 12b. Moreover, the dummy conductors 31 may be connected to only one of the outer electrode 12a and 12b.

With the second modification, since the dummy conductors 31 are disposed in the outer layer portion on the lower side, which is comparatively thick and is made up of only the ceramic layers in the laminate 11, the outer layer portion on the lower side is hardened and the problem of warping of the laminate 11 can be overcome.

Third Modification of a Preferred Embodiment

Figure 10:
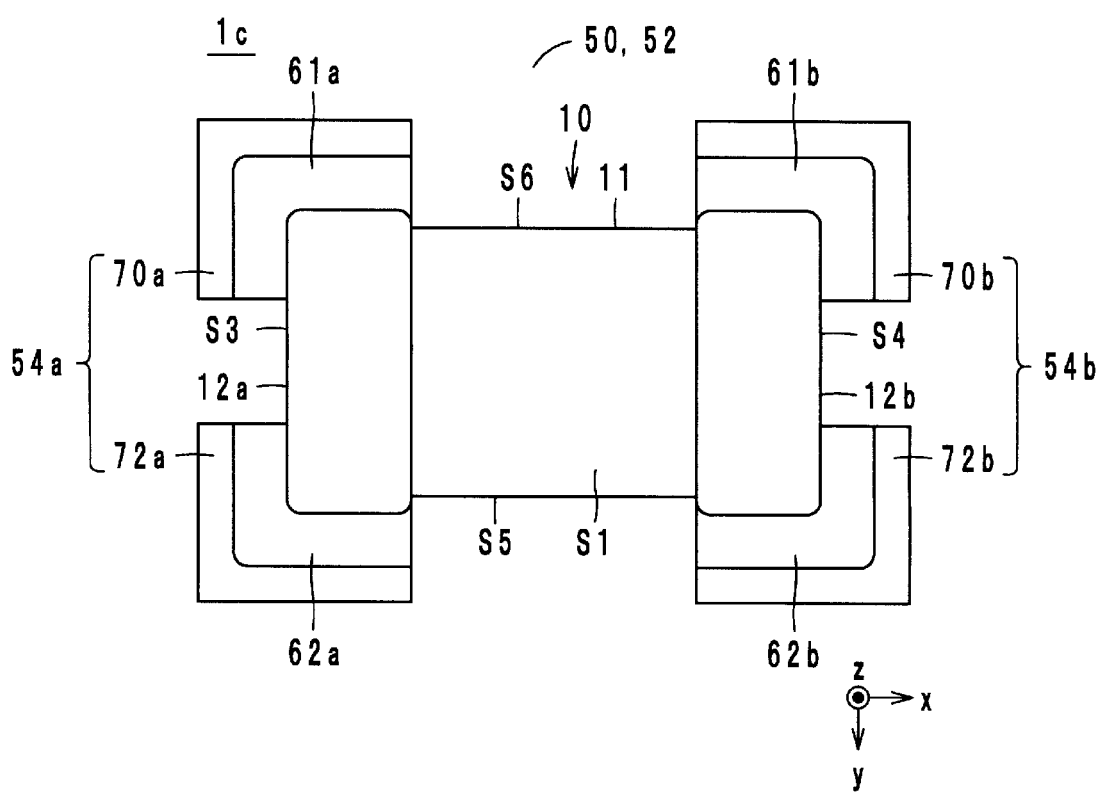
FIG. 10 is a plan view of a mounting structure according to a third modification of a preferred embodiment of the present invention.

A mounting structure 1c according to a third modification of a preferred embodiment of the present invention will be described below with reference to the drawings. FIG. 10 is a plan view of the mounting structure 1c according to the third modification.

The mounting structure 1c differs from the above-described mounting structure 1 in the construction of the land electrode 54. In the mounting structure 1c, the land electrode 54a is divided into land portions 70a and 72a. The land portions 70a and 72a preferably are each substantially rectangular and are arranged in the order from the negative side to the positive side in the y-axis direction. Further, the land portions 70a and 72a are overlapped with adjacent corners of the laminate 11, respectively, when looking at the laminate 11 in a plan view from the z-axis direction (i.e., from the direction normal to the board body 50). In more detail, when looking at the laminate 11 in a plan view from the z-axis direction, the land portions 70a and 72a are overlapped respectively with corners of the laminate 11, which are positioned at both ends of the short side of the laminate 11 on the negative side in the x-axis direction. The land portions 70a and 72a are connected to the outer electrode 12a through solders 61a and 62a, respectively.

When looking at the laminate 11 in a plan view from the z-axis direction, however, the land portions 70a and 72a are not overlapped with a center of the end surface S3 (i.e., a point at which diagonal lines of the end surface S3 intersect). Accordingly, the solders 61a and 62a are also not overlapped with the center of the end surface S3 when looking at the laminate 11 in a plan view from the z-axis direction.

Similarly, the land electrode 54b is divided into land portions 70b and 72b. The land portions 70b and 72b preferably are each substantially rectangular and are arranged in the order from the negative side to the positive side in the y-axis direction. Further, the land portions 70b and 72b are overlapped with adjacent corners of the laminate 11, respectively, when looking at the laminate 11 in a plan view from the z-axis direction (i.e., from the direction normal to the board body 50). In more detail, when looking at the laminate 11 in a plan view from the z-axis direction, the land portions 70b and 72b are overlapped respectively with corners of the laminate 11, which are positioned at both ends of the short side of the laminate 11 on the positive side in the x-axis direction. The land portions 70b and 72b are connected to the outer electrode 12b through solders 61b and 62b, respectively.

When looking at the laminate 11 in a plan view from the z-axis direction, however, the land portions 70b and 72b are not overlapped with a center of the end surface S4 (i.e., a point at which diagonal lines of the end surface S4 intersect). Accordingly, the solders 61b and 62b are also not overlapped with the center of the end surface S4 when looking at the laminate 11 in a plan view from the z-axis direction.

The mounting structure 1c can more effectively reduce the acoustic noise in comparison with the above-described mounting structure 1 as discussed below. In the mounting structure 1c, each land electrode 54 is divided into the land portions 70 and 72. Therefore, areas in which the outer electrodes 12 and the land electrodes 54 are connected to each other through the solders 61 and 62 in the mounting structure 1c are smaller than areas in which the outer electrodes 12 and the land electrodes 54 are connected to each other through the solders 60 in the mounting structure 1. As a result, vibration generated in the electronic component 10 is less transmittable to the circuit board 50 in the mounting structure 1c than in the mounting structure 1. Hence, the acoustic noise is reduced to a lower level in the mounting structure 1c than in the mounting structure 1.

In addition, when an AC voltage is applied to the electronic component 10, the center of each of the end surfaces S3 and S4 (i.e., the point at which diagonal lines of each of the end surfaces S3 and S4 intersect) vibrates in a larger magnitude. Therefore, when the electronic component 10 is fixed to the land electrodes 54 at positions just under the centers of the end surfaces S3 and S4, the vibration is more transmittable to the circuit board 50 from the electronic component 10. In view of such a point, each land electrode 54 is divided into the land portions 70 and 72 in the mounting structure 1c for the electronic component 10. When looking at the laminate 11 in a plan view from the z-axis direction, the land portions 70 and 72 are not overlapped with the centers of the end surfaces S3 and S4, respectively. Thus, the solders 61 and 62 are not overlapped with the centers of the end surfaces S3 and S4, respectively, when looking at the laminate 11 in a plan view from the z-axis direction. As a result, transmission of the vibration from the electronic component 10 to the circuit board 50 is significantly reduced and prevented.

For more positively confirming the advantageous effects of the mounting structure 1c, the inventors of this application conducted experiments as follows. In more detail, the inventors prepared a first sample and a second sample described below. An AC voltage of 1 Vpp was applied to the electronic component 10 of each of the first sample and the second sample, and a sound pressure was measured while a frequency was changed.

Figure 11:
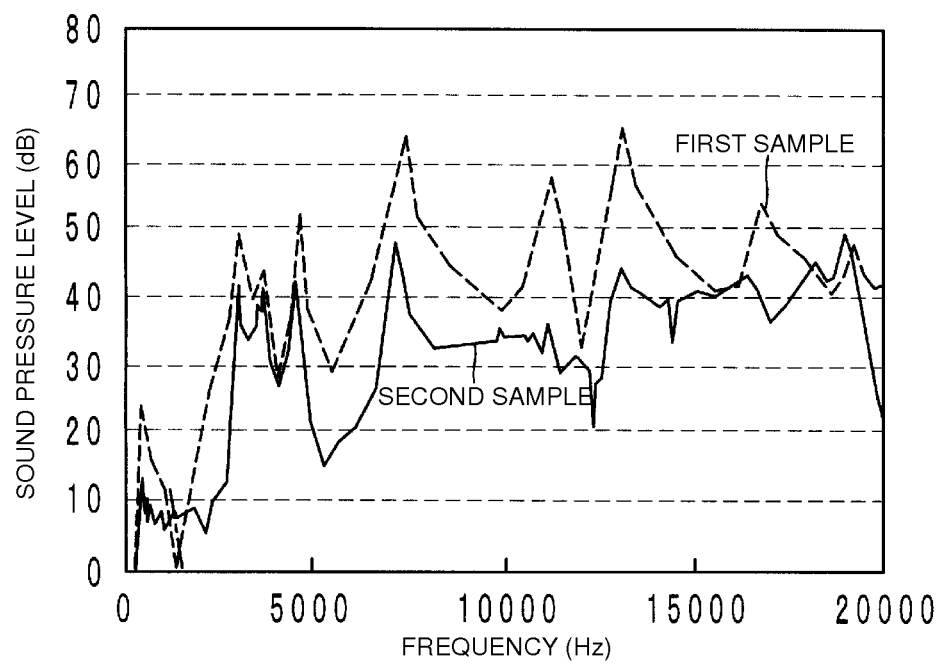
FIG. 11 is a graph representing experimental results with the third modification of a preferred embodiment of the present invention.

The first sample has the mounting structure 1 illustrated in FIG. 1. The second sample has the mounting structure 1c illustrated in FIG. 10. FIG. 11 is a graph representing the experimental results. In the graph, the vertical axis indicates a sound pressure level, and the horizontal axis indicates a frequency.

As seen from FIG. 11, the sound pressure level of the second sample is lower than that of the first sample. It can be thus understood that the acoustic noise is reduced with the division of the land electrode 54.

Second Preferred Embodiment

Figure 12:
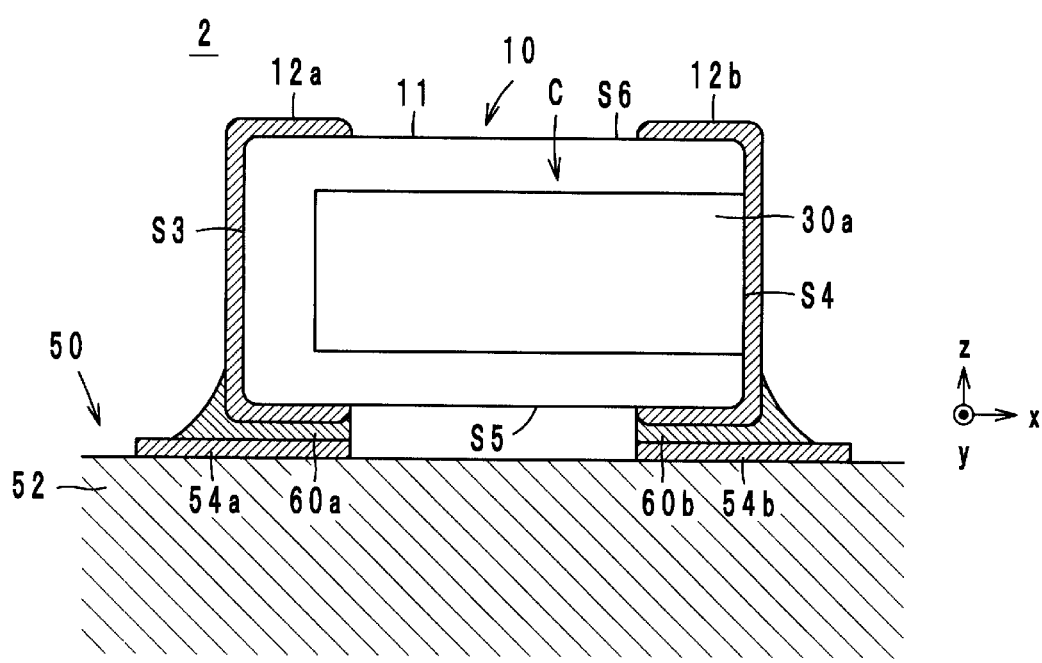
FIG. 12 is a sectional structural view of a mounting structure according to a second preferred embodiment of the present invention.
Figure 13:
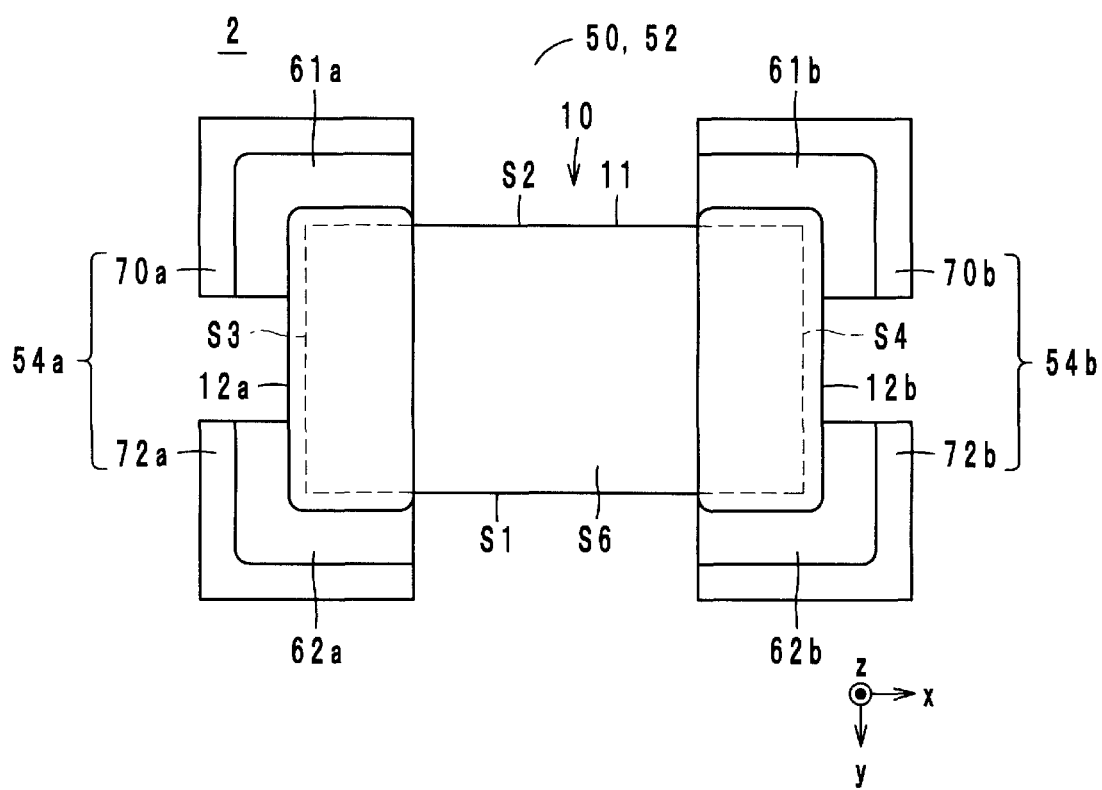
FIG. 13 is a plan view of the mounting structure according to the second preferred embodiment of the present invention when viewed from the positive side in a z-axis direction.

A mounting structure 2 according to a second preferred embodiment will be described below with reference to the drawings. FIG. 12 is a sectional structural view of the mounting structure 2 according to the second preferred embodiment. FIG. 13 is a plan view of the mounting structure 2 illustrated in FIG. 12 when viewed from the positive side in the z-axis direction.

The mounting structure 2 differs from the above-described mounting structure 1 in the orientation of the electronic component 10. In the mounting structure 2, the lateral surface S5 positioned on one side of the laminate 11 in the direction perpendicular or substantially perpendicular to the lamination direction serves as a mounting surface. In the second preferred embodiment, the lamination direction is defined as the y-axis direction. Further, when looking at the laminate 11 in a plan view from the y-axis direction, a direction in which the long side of the laminate 11 extends is defined as the x-axis direction. When looking at the laminate 11 in a plan view from the y-axis direction, a direction in which the short side of the laminate 11 extends is defined as the z-axis direction.

As illustrated in FIG. 13, in the mounting structure 2, the land electrode 54a is divided into land portions 70a and 72a. The land portions 70a and 72a preferably are each substantially rectangular and are arranged in the order from the negative side to the positive side in the y-axis direction. Further, the land portions 70a and 72a are overlapped with adjacent corners of the laminate 11, respectively, when looking at the laminate 11 in a plan view from the z-axis direction (i.e., from the direction normal to the board body 50). In more detail, when looking at the laminate 11 in a plan view from the z-axis direction, the land portions 70a and 72a are overlapped respectively with corners of the laminate 11, which are positioned at both ends of the short side of the laminate 11 on the negative side in the x-axis direction. The land portions 70a and 72a are connected to the outer electrode 12a through solders 61a and 62a, respectively.

When looking at the laminate 11 in a plan view from the z-axis direction, however, the land portions 70a and 72a are not overlapped with a center of the end surface S3 (i.e., a point at which diagonal lines of the end surface S3 intersect). Accordingly, the solders 61a and 62a are also not overlapped with the center of the end surface S3 when looking at the laminate 11 in a plan view from the z-axis direction.

Similarly, the land electrode 54b is divided into land portions 70b and 72b. The land portions 70b and 72b are each substantially rectangular and are arranged in the order from the negative side to the positive side in the y-axis direction. Further, the land portions 70b and 72b are overlapped with adjacent corners of the laminate 11, respectively, when looking at the laminate 11 in a plan view from the z-axis direction (i.e., from the direction normal to the board body 50). In more detail, when looking at the laminate 11 in a plan view from the z-axis direction, the land portions 70b and 72b are overlapped respectively with corners of the laminate 11, which are positioned at both ends of the short side of the laminate 11 on the positive side in the x-axis direction. The land portions 70b and 72b are connected to the outer electrode 12b through solders 61b and 62b, respectively.

When looking at the laminate 11 in a plan view from the z-axis direction, however, the land portions 70b and 72b are not overlapped with a center of the end surface S4 (i.e., a point at which diagonal lines of the end surface S4 intersect). Accordingly, the solders 61b and 62b are also not overlapped with the center of the end surface S4 when looking at the laminate 11 in a plan view from the z-axis direction.

With the mounting structure 2 according to the second preferred embodiment, as described below, the acoustic noise is significantly reduced while a high degree of freedom in circuit design is obtained. FIG. 14 illustrates a state where the electronic component 10 vibrates in the mounting structure 2.

In the mounting structure 2, as illustrated in FIG. 14, when an AC voltage is applied to the electronic component 10, the center of each of the end surfaces S3 and S4 (i.e., the point at which diagonal lines of each of the end surfaces S3 and S4 intersect) vibrates in a larger magnitude. Therefore, when the electronic component 10 is fixed to the land electrodes 54 at positions just under the centers of the end surfaces S3 and S4 (on the negative side in the z-axis direction), the vibration is more transmittable to the circuit board 50 from the electronic component 10. In view of such a point, each land electrode is divided into the land portions 70 and 72 in the mounting structure 2. When looking at the laminate 11 in a plan view from the z-axis direction, the land portions 70 and 72 are not overlapped respectively with the centers of the end surfaces S3 and S4, which are vibration sources. Accordingly, the solders 61 and 62 are also not overlapped with the centers of the end surfaces S3 and S4 when looking at the laminate 11 in a plan view from the z-axis direction. Thus, in the mounting structure 2, the solders 61 and 62 each acting as a transmission path for the vibration are positioned apart from the centers of the end surfaces S3 and S4, which are the vibration sources. With such an arrangement, the vibration generated in the electronic component 10 is less transmittable to the circuit board 50. As a result, the acoustic noise is reduced in the mounting structure 2.

For more positively confirming the advantageous effect of the mounting structure 2, the inventors of this application conducted experiments as follows. In more detail, the inventors prepared a third sample and a fourth sample described below. An AC voltage of 1 Vpp was applied to the electronic component 10 of each of the third sample and the fourth sample, and a sound pressure was measured while a frequency was changed.

The third sample has the mounting structure 2 illustrated in FIGS. 12 to 14. The fourth sample has a mounting structure obtained by modifying the mounting structure 2, illustrated in FIGS. 12 to 14, such that the electronic component 10 is mounted in the orientation illustrated in FIG. 12 on the circuit board 50, but the land electrodes 54 of the circuit board 50 are each not divided. FIG. 15 is a graph representing the experimental results. In the graph, the vertical axis indicates a sound pressure level, and the horizontal axis indicates a frequency.

As seen from FIG. 15, the sound pressure level of the third sample is lower than that of the fourth sample. It can be thus understood that the acoustic noise is reduced in the mounting structure 2 with the division of the land electrode 54.

Other Preferred Embodiments

It is to be noted that the mounting structure according to the present invention is not limited to the above-described preferred embodiments and it can be variously modified within the scope of the present invention.

In particular, although the land electrodes 54a and 54b preferably are each divided into two portions in the second preferred embodiment (see FIGS. 12 to 15), only one of the land electrodes 54a and 54b may be divided into two portions.

As described above, preferred embodiments of the present invention are useful for the mounting structure of the electronic component and are especially superior in an ability of reducing the acoustic noise while ensuring a high degree of freedom in circuit design.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a laminate including a plurality of laminated dielectric layers, the laminate including a bottom surface and a top surface opposed to each other and a first end surface and a second end surface opposed to each other;
   a plurality of capacitor conductors laminated together with the plurality of dielectric layers to form a capacitor, and led out to one of the first end surface and the second end surface;
   a first outer electrode disposed to extend over the first end surface and partially over the bottom surface, and connected to the plurality of capacitor conductors led out to the first end surface; and
   a second outer electrode disposed to extend over the second end surface and partially over the bottom surface, and connected to the plurality of capacitor conductors led out to the second end surface; wherein
   a distance between the bottom surface and a capacitor conductor of the plurality of capacitor conductors disposed closest to the bottom surface is greater than a distance between the top surface and a capacitor conductor of the plurality of capacitor conductors disposed closest to the top surface.

2. The electronic component according to claim 1, wherein at least one dummy conductor is disposed between the bottom surface and the capacitor conductor of the plurality of capacitor conductors disposed closest to the bottom surface.

3. The electronic component according to claim 1, wherein the plurality of dielectric layers and the plurality of capacitor conductors extend parallel or substantially parallel to the bottom surface and the top surface.

4. The electronic component according to claim 1, wherein the laminate has a substantially rectangular parallelepiped shape.

5. The electronic component according to claim 1, wherein each of the first and second outer electrodes extends partially over the top surface of the laminate.

6. The electronic component according to claim 1, wherein each of the first and second outer electrodes extends partially over the top surface of the laminate and partially over lateral surfaces of the laminate extending between the first and second end surfaces of the laminate and perpendicularly or substantially perpendicularly to the top and bottom surface of the laminate.

7. The electronic component according to claim 1, wherein each of the plurality of capacitor conductors is led out to only one of the first end surface and the second end surface and is not led out to any other surfaces of the laminate.

8. The electronic component according to claim 2, wherein the at least one dummy electrode is disposed in a central portion of the laminate and is not connected to either of the first and second outer electrodes.

9. The electronic component according to claim 2, wherein both ends of the at least one dummy electrode are connected respectively to the first and second outer electrodes.

10. The electronic component according to claim 2, wherein the at least one dummy electrode includes a plurality of dummy electrodes.

* * * * *